United States Patent [19]

Hisada et al.

[11] Patent Number: 4,750,043
[45] Date of Patent: Jun. 7, 1988

[54] DECODING APPARATUS FOR IMAGE CODE

[75] Inventors: Katsutoshi Hisada; Nobuaki Kokuba, both of Tokyo; Shigeki Sakurai, Yokohama; Yukio Murata, Kawasaki; Tatsuo Okano, Yokohama, all of Japan

[73] Assignee: Canon Kabushiki Kaisha, Tokyo, Japan

[21] Appl. No.: 892,114

[22] Filed: Aug. 4, 1986

[30] Foreign Application Priority Data

| Aug. 8, 1985 | [JP] | Japan | 60-175306 |
| Aug. 8, 1985 | [JP] | Japan | 60-175307 |
| Aug. 8, 1985 | [JP] | Japan | 60-175308 |
| Aug. 8, 1985 | [JP] | Japan | 60-175309 |
| Aug. 8, 1985 | [JP] | Japan | 60-175310 |
| Aug. 8, 1985 | [JP] | Japan | 60-175311 |

[51] Int. Cl.⁴ .......................................... H04N 1/419
[52] U.S. Cl. ..................................... 358/261; 358/263
[58] Field of Search ............... 358/260, 261, 280, 263; 340/347 DD

[56] References Cited

U.S. PATENT DOCUMENTS

| 3,941,922 | 3/1976 | Tsuchiya et al. | 358/261 |
| 4,013,827 | 3/1977 | Starck et al. | 358/263 |
| 4,090,222 | 5/1978 | Nakagome et al. | 358/280 |
| 4,207,599 | 6/1980 | Murayama et al. | 358/261 |
| 4,262,309 | 4/1981 | Yamaguchi et al. | 358/260 |
| 4,610,027 | 9/1986 | Anderson | 358/261 |

Primary Examiner—Edward L. Coles, Sr.
Attorney, Agent, or Firm—Fitzpatrick, Cella, Harper & Scinto

[57] ABSTRACT

A decoder for two-dimensionally encoded image codes such as modified READ or modified READ codes ensures fast decoding operation by outputting reference codes in parallel while serially discriminating input codes and monitoring the relationship of both codes.

22 Claims, 17 Drawing Sheets

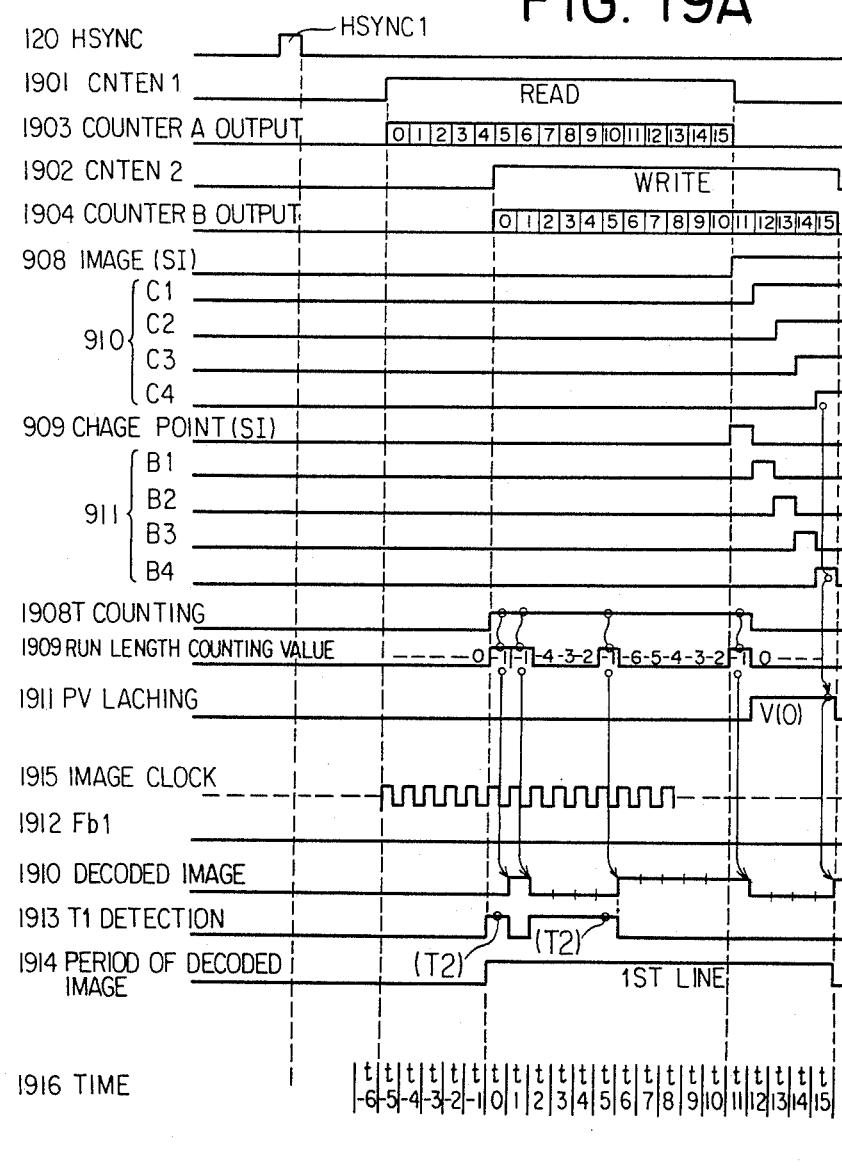

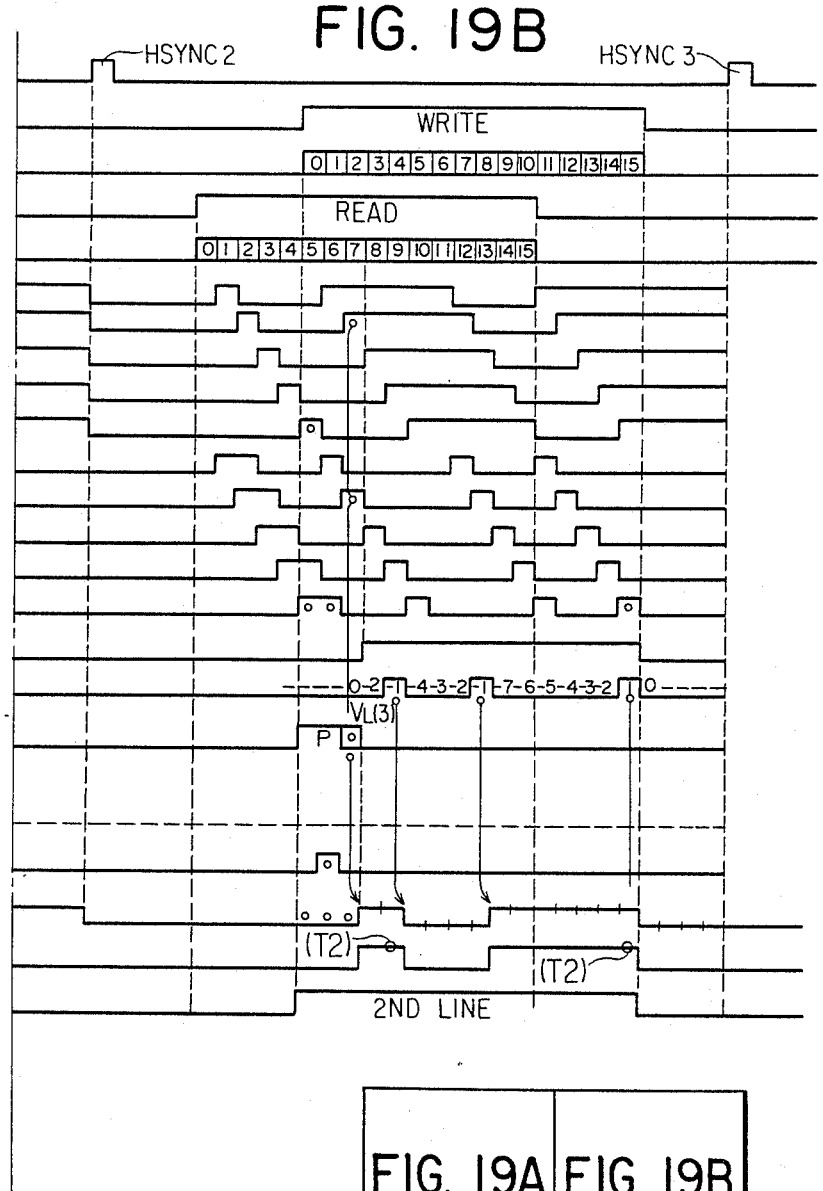

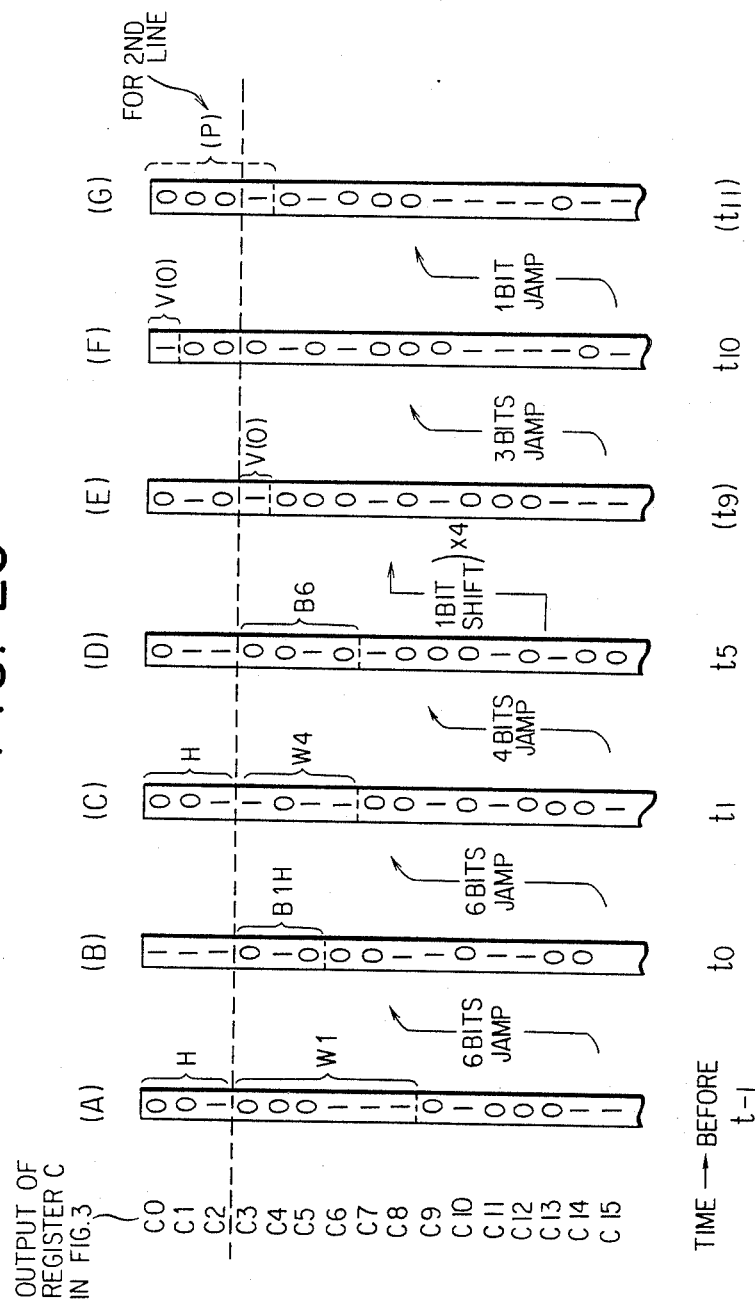

DECODING APPARATUS FOR IMAGE CODE

BACKGROUND OF THE INVENTION

1. Field of the Invention

The present invention relates to a decoding apparatus for image codes, and in particular a decoding apparatus for image codes obtained by two-dimensional encoding such as modified READ (MR) encoding or modified modified READ (MMR) encoding.

In image transmitting apparatus such as facsimile or image files utilizing optical disks or magnetic disks, high-speed and efficient transmitting or accumulating operation is achieved through compression of image data.

For such compression of image data, MR and MMR encoding processes are generally known as disclosed in the Notification Nos. 1013, 1981 of the Japanese Ministry of Postal Service for two-dimensional encoding process and in the Notification Nos. 197, 1985 of the Japanese Ministry of Postal Service for high-efficiency two-dimensional encoding process.

In two-dimensional encoding, such as MR or MMR encoding, the codes represent the relationship between the image signals of a line to be encoded and the image signals of a preceding line. Consequently the decoding of such two-dimensionally encoded image codes necessitates a complex process for discriminating the relationship between the input image codes and the already decoded image signals of a preceding line, and such process has been conducted by means of software in, for example, a microcomputer. Thus the discrimination of an image code sometimes requires several steps. Therefore high-speed decoding operation is sometimes not possible since a succeeding image code may not be decoded immediately.

Also in two-dimensional encoding such as MR or MMR encoding, the length of obtained image codes is not necessarily uniform. Consequently, after a decoding operation, in order to prepare a succeeding code ready for decoding, the succeeding code is taken in according to the length of already decoded code. However, if the decoding time is short in comparison with the code length, the decoding operation may be interrupted since the succeeding code may not yet be ready for decoding when the decoding operation should be initiated.

Also in the two-dimensional encoding such as MR or MMR encoding, the relationship between the image signals of a line to be encoded and those of a preceding line is represented by codes of plural modes, and, in the horizontal mode among such plural modes, there are required an identification code indicating the horizontal mode and plural codes indicating the run length. Thus the horizontal mode is discriminated by the identification code, and the run length is identified in a following step. However, the decoding operation may be interrupted in such operation, since a succeeding code cannot be processed immediately if the run length is short.

The encoded image signals are decoded as explained above, and the decoded image signals are then supplied to a process unit such as a printer. However, in a case in which there are provided plural process units, it has been necessary to provide plural decoding circuits respectively matching the speeds of said plural process units or to provide a buffer memory for speed matching.

SUMMARY OF THE INVENTION

In consideration of the foregoing, an object of the present invention is to enable high-speed decoding of image codes.

Another object of the present invention is to enable decoding of two-dimensionally encoded image codes, such as obtained by MR or MMR encoding, without interruption and without delay in supply to an output unit.

Still another object of the present invention is to adapt a decoding apparatus to various process units.

According to one aspect of the present invention, high-speed decoding operation is enabled through high-speed discrimination of the relationship between input image codes and a reference image line by releasing image information of the reference line a predetermined number of pixels at a time in parallel and forming image signals from the result of discrimination of image codes and reference line image information.

Still another object of the present invention is to enable high-speed decoding operation without interruption in decoding the image codes of different code lengths, which is achieved according to one aspect of the invention by varying the decoding operation for a succeeding code according to a preceding code discriminated in the decoding operation.

Still another object of the present invention is to enable high-speed decoding operation without delay in the decoding of two-dimensionally encoded image codes such as obtained by MR or MMR encoding, which is achieved according to one aspect of the invention by simultaneously discriminating an identification code indicating the encoding mode and a succeeding image code.

Still another object of the present invention is to enable high-speed decoding operation in the decoding of two-dimensionally encoded image codes such as obtained by MR or MMR encoding, which is achieved according to one aspect of the invention by immediately decoding an image code without the release of an identification code indicating the encoding mode.

Still another object of the present invention is to enable accurate decoding operation, which is achieved according to one aspect of the invention by starting the decoding operation after fetching the image signals of a predetermined number of pixels in the reference line necessary for the decoding of image codes.

Still another object of the present invention is to enable the common use of a decoding apparatus for various output devices, which is done according to one aspect of the invention by effecting the decoding operation in synchronization with clock signals, thereby enabling matching of the decoding operation with the function of such output device, for example a printer.

The foregoing and still other objects of the present invention, and the advantages thereof, will become fully apparent from the following description.

BRIEF DESCRIPTION OF THE DRAWINGS

FIG. 19, consisting of FIGS. 19A and 19B, is a timing chart showing a decoding operation; and FIG. 20 is a chart showing shift operation of a register.

DETAILED DESCRIPTION OF THE PREFERRED EMBODIMENTS

Now the present invention will be clarified in detail by embodiments shown in the attached drawings.

Figure 1:
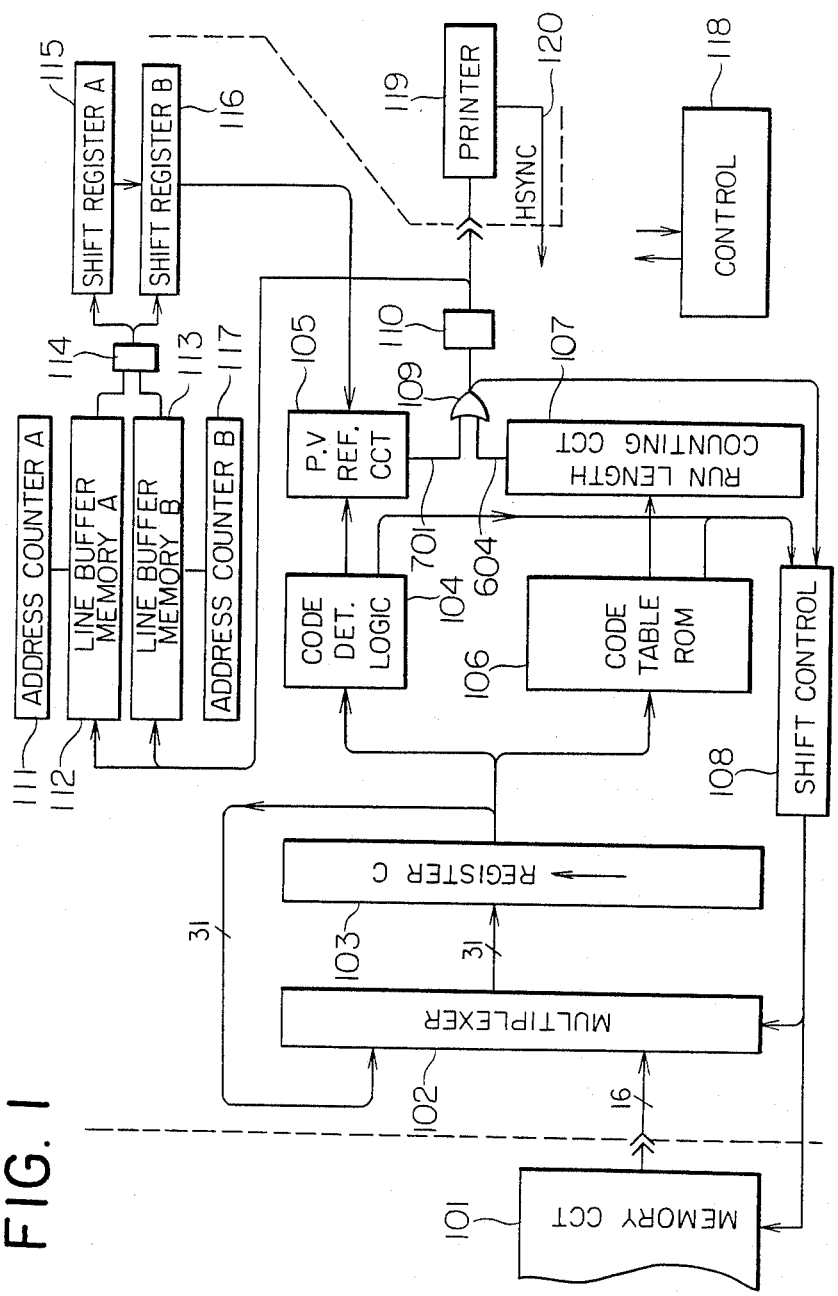
FIG. 1 is a block diagram of a decoding circuit embodying the present invention.

At first, for outlining the operation, reference is made to FIG. 1 showing a block diagram of a decoding circuit embodying the present invention. In the present embodiment there will be explained the decoding of MMR encoded image codes, but it is also applicable to other two-dimensional encoding such as MR encoding.

In the following there will be explained the MMR encoding rule employed in the present embodiment. In this encoding process, the image line to be encoded is called a coding line, and an image line immediately preceding said coding line is called a reference line. The coding line is encoded according to the positional relationship of changing points in said coding line and those in said reference line.

In the MMR encoding, the above-mentioned relationship is detected by the symbols $a_0$, $a_1$, $a_2$, $b_1$, $b_2$ etc. defined as follows.

$a_0$: a pixel on the coding line, defining the start of encoding;

$a_1$: a first changing point (pixel) positioned to the right of $a_0$ on said coding line;

$a_2$: a first changing point (pixel) positioned to the right of $a_1$ on said coding line;

$b_1$: a first changing point (pixel) positioned to the right of $a_0$ on the reference line and of a color opposite to that of $a_0$;

$b_2$: a first changing point (pixel) positioned to the right of $b_1$ on the reference line.

Thus the points $a_0$, $a_1$ and $a_2$ are positioned on the coding line, and the points $b_0$ and $b_1$ are positioned on the refernece line. The encoding mode is uniquely selected from the following three modes, according to the relative positional relationship or distance of the group of points $a_0$, $a_1$, $a_2$ and the group of points $b_1$, $b_2$:

(1) pass mode (P mode): when $b_2$ is positioned to the left of $a_1$ (only one code is generated);

(2) vertical mode (V mode): in the case that of $|a_1 b_1| \leq 3$ (seven different codes are generated according to the distance); and (3) horizontal mode (H mode): cases other than (1) or (2) (according to a run length code table);

Format: $H + M(a_0 a_1) + M(a_1 a_2)$ wherein H is a code indicating the H mode, $M(a_0 a_1)$ is a white or black run length code of $|a_0 a_1|$, and $M(a_1 a_2)$ is a black or white run length code of $|a_1 a_2|$. In the case that two or more of the conditions (1), (2) and (3) are simultaneously satisfied, the mode is selected in the following preferential order:

(1) P mode > (2) V mode > (3) H mode.

In the following there will be explained a circuit for decoding the image data encoded by the above-explained MMR encoding rule.

Figures 2A, 2B:
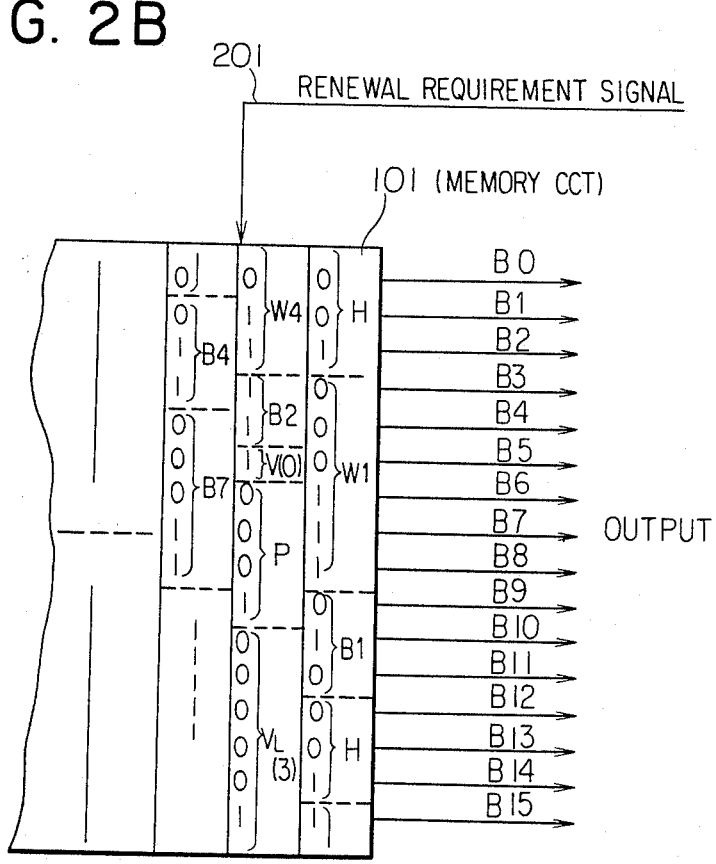
FIGS. 2A and 2B are views showing a code to be decoded.

Referring to FIG. 1, a memory circuit 101 stores image codes to be decoded (hereinafter simply called codes). Said memory circuit 101 stores serial codes, for example received from a communication line as shown in FIG. 2A, after division into parallel data of 16 bits as shown in FIG. 2B, regardless of the partition of the codes. Said memory circuit 101 can be composed of random access memories (RAM) or latch circuits.

The memory circuit 101 is capable of renewing parallel output data B0–B15, in response to an external request signal 201.

A multiplexer 102 and a register C 103 constitute a bit shifter. A code of 16 bits read in parallel manner from the memory circuit 101 is guided through the multiplexer 102 and stored in the register C 103. A shift control circuit 108 controls the input and output of the multiplexer 102 to displace the code data in one direction in the register C 103, by a number of bits designated by said shift control circuit 108.

A code detection logic circuit 104 and a code table ROM 106 constitute a circuit for receiving a code in a predetermined position in the register C 103 to discriminate the content of said code. More specifically, the ROM 106 is provided with a table, storing run lengths and code lengths corresponding to the input codes in the horizontal (H) mode, and is adapted to release corresponding data by making access to said table. The run length data indicating the run length, released from the ROM 106, are supplied to a run length counting circuit 107.

Said run length counting circuit 107, upon making a count equal to the number from the ROM 106, supplies a count end pulse to an image regenerating circuit 110, etc.

The code length data, obtained as a part of the output from the ROM 106, are supplied to the shift control circuit 108, which thus controls the multiplexer 102 to shift the code data in the register C 103 by the number of bits of code length of thus discriminated code. In this manner a discriminated code is discharged from the register C 103, and a succeeding code is moved to a predetermined position in the register C 103 for enabling discrimination by the ROM 106, etc. In this operation the shift control circuit 108 sums up the amount of movement of the code instructed to the multiplexer 102, and supplies a new 16-bit code in parallel manner from the memory circuit 101 to the register C 103 through the multiplexer 102 each time said sum reaches a value corresponding to a shift of 16 bits. The code detecting logic circuit 104 effects a detecting function when a particular code is present in the register C 103 as will be explained later, and supplies the result of detection to a PV reference circuit 105. Code length data of the particular code detected by the code detecting logic circuit 104 are also supplied to the shift control circuit 108, which performs a function as explained before.

Line buffer memories A 112 and B 113 are respectively capable of storing image of an image line and are composed for example of random access memories. Address counters A 111 and B 117 are provided for designating read or write addresses of the buffer memories A 112 and B 113, which constitute a double buffer structure in which either memory is in the write mode while the other is in the read mode. Said buffer memories A 112 and B 113 are provided for storing image data of the reference line, required for decoding two-dimensionally encoded image codes obtained with, for example, MR or MMR encoding. A control circuit 118 is provided to generate control signals for controlling the function of various circuit blocks shown in FIG. 1, which function in mutual synchronization, utilizing the clock signals generated by the control circuit 118 as common timing signals.

In the following there will be given more detailed explanation of the function of the circuit blocks shown in FIG. 1. The multiplexer 102 and the register C 103 constitute a bit shifter as explained before, of a structure as shown in FIG. 3. Prior to the start of decoding operation, first one word or 16 bits (B0–B15) of the code data sotred in the memory circuit 101 as shown in FIG. 2(B) are moved, through a multiplexer B 1021 shown in FIG. 3, to the shift register C 103, of which the output is supplied through a multiplexer A 1022, again to the register C 103. This operation is-interrupted when the first bit of said code appears as the output C0 of the register C 103. In this state the preparation for decoding operation is completed.

The above-explained displacement of code data is controlled by signals Σ1–Σ4, CR, ST1–ST8 from the shift control circuit 108 shown in FIG. 1 and signals S0–S3 from the code detecting logic circuit 104. The bit shifter composed of the multiplexer 102 and the register C 103 has two shift functions, e.g., a serial shift of one bit at a time and a jump shift of one to nine bits at a time. In the present embodiment, the register C 103 is composed of a 31-bit parallel-in-parallel-out register, with one-directional shift as indicated by an arrow in FIG. 3. The code shown in the register C 103 is an example of the code transferred from the memory circuit 101 to a decoding ready position in said register C 103 by the displacing function of the bit shifter.

Figure 4:
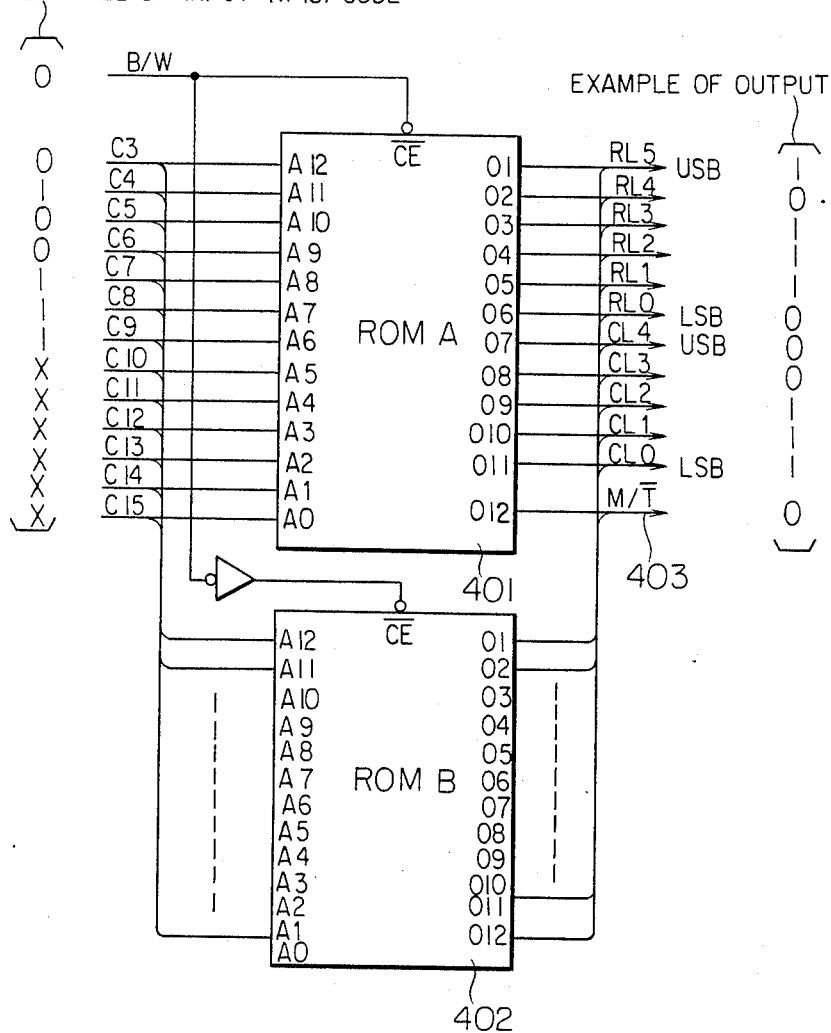
FIG. 4 is a block diagram of an example of a code table ROM.

FIG. 4 shows the structure of the code table ROM 106 shown in FIG. 1, wherein are provided ordinary read-only memories (ROM) 401, 402, each having 13-bit address input ports A0–A12, a 1-bit chip enable input port $\overline{CE}$ and 12-bit data output ports O1–O12. A signal to the chip enable input port $\overline{CE}$ selects either the ROM A 401, constituting a white code table, or the ROM B 402, constituting a black code table.

Figure 3:
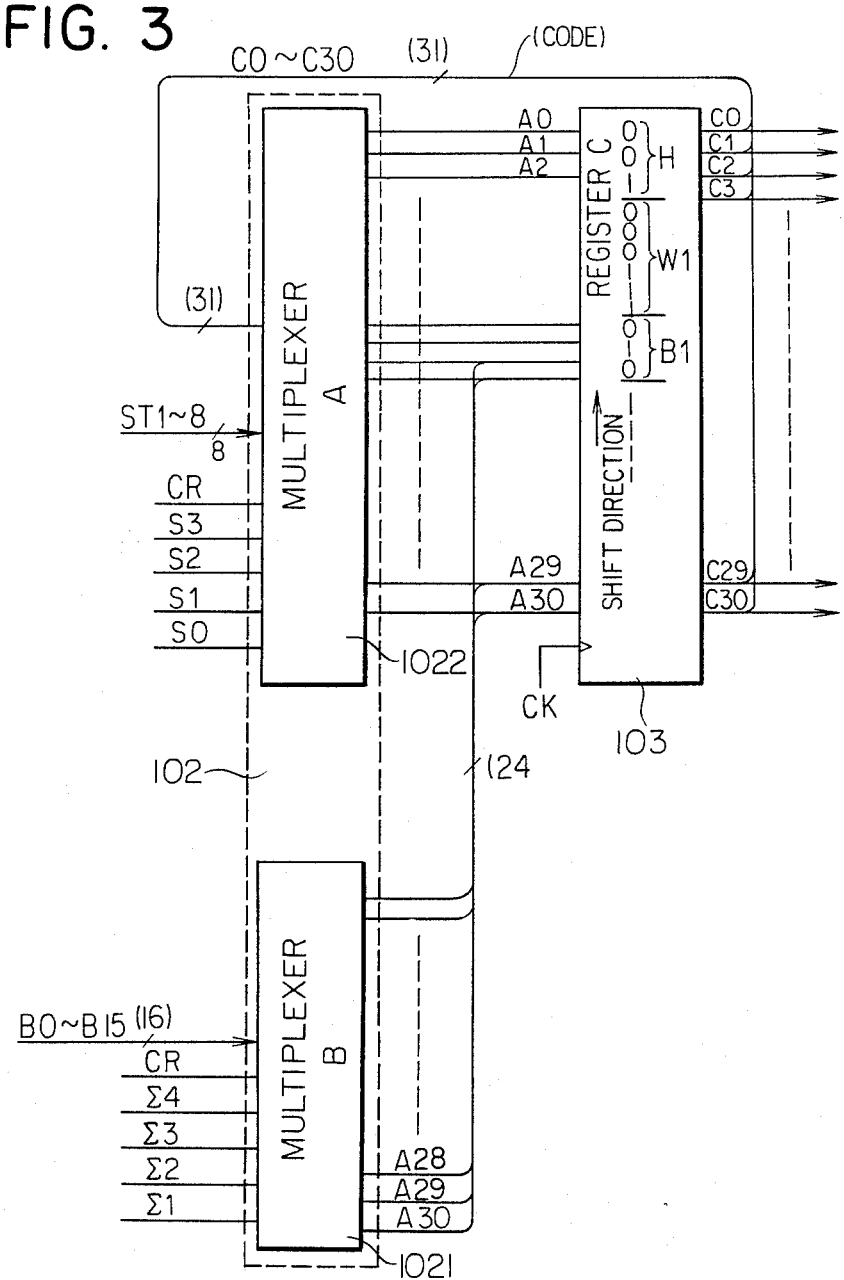
FIG. 3 is a block diagram showing an example of a bit shifter.

Since the ROM's A 401 and B 402 are constructed alike, there will be explained, in the following, the content of memory of the ROM A 401. The output signal C3 of the register C 103 shown in FIG. 3, is supplied to the most significant bit (MSB) A12 of the address input ports of the ROM A 401, and the output signals C4–C15 of said register C 103 are supplied, in parallel manner, to the succeeding address input ports A11–A0. Also the input port $\overline{CE}$ of the ROM A 401 receives a black/white color signal B/$\overline{W}$ of the code. The output signal C3 is the most significant bit of various codes other than an H-mode code "001" representing the H-mode. From an address designated by a code supplied to the ROM A 401, there are released, in parallel manner, run length data of said code (RL5–RL0), code length data (CL4–CL0) and a signal M/$\overline{T}$ indicating whether said code is a makeup code or a terminating code. The run length code is discriminated from the output signals C3–C15 of the register C 103. Thus, without discharging a 3-bit code indicating the H-mode from the register, a succeeding run length code can be discriminated, to achieve a high-speed decoding operation.

The example shown in FIG. 4 indicates the output signals for a case in which the ROM 106 receives a code for a white run of 18 bits "0100111". The run length "18" is represented as a binary compliment of 2, i.e., "101110". Though the run length is usually represented by 12 bits, the lower 6 bits alone are released for a terminating code since the upper 6 bits are all "1", and the upper 6 bits alone are released for a makeup code, since the lower 6 bits are all "0". In the example shown in FIG. 4, output signals CL4–CL0 are "00111", indicating the code length "7" of the white 18-bit run code. At the same time the output singal M/$\overline{T}$ is "0", indicating that the entered code is a terminating code. M/$\overline{T}$=1 indicates a makeup code.

The content of the ROM A 401 is so allotted for each entered code that addresses receiving no entry due to a short length of code have a value "DON'T CARE", and the employed codes are mutually so designed as not to cause confusion by the presence of such "DON'T CARE" bits.

Figure 5:
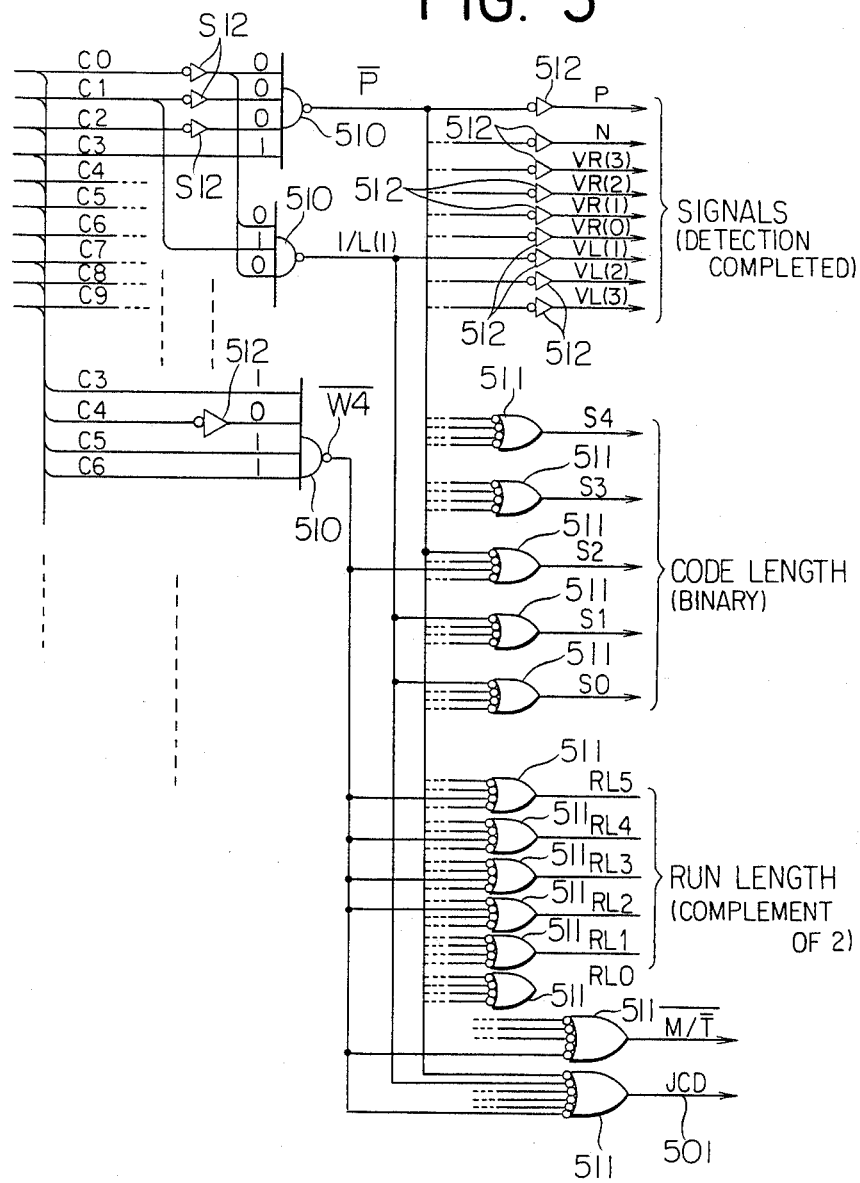
FIG. 5 is a block diagram of an example of a code detection logic circuit.

FIG. 5 shows an example of the structure of the code detecting logic circuit 104 shown in FIG. 1. Said circuit discriminates the codes shown in Tables 1 and 2 by means of NAND gates 510, OR gates 511 and inverters 512, and releases a code detection signal, code length data (S0–S4) of the detected code, and run length data (RL0–RL5) thereof. A JCD signal 501 indicates the detection of any of the codes shown in Tables 1 and 2. Since the data from the register C 103 shown in FIG. 3 are supplied both to the ROM shown in FIG. 4 and the logic circuit shown in FIG. 5, the decoded data may be obtained from both. Thus, if the logic circuit shown in FIG. 5 detects a code, the JCD signal cancels the output of the ROM shown in FIG. 4, thus giving priority to the decoding output of the logic circuit shown in FIG. 5.

FIG. 5 illustrates detection of P-code "0001", VL(1)-code "010" and W4-code "1011" among those listed in Tables 1 and 2, but other codes can be detected similarly. Tables 1 and 2 show codes for which a succeeding code cannot be brought to the decoding position in time by bit-by-bit shifts in the register C 103 of a number of clocks required for forming image data from the code, for example those codes for which the code length is equal to or longer than the run length represented by said codes.

For the codes of group 1 shown in Table 1, the predetermined detecting position is defined by a state in which the MSB bit of said code is positioned at C0 of the register C 103 shown in FIG. 3. For the codes of group 2 shown in Table 2, said predetermined position is defined by a state in which the MSB bit of said code is positioned at C3 of said register C 103. The codes shown in Tables 1 and 2 are collectively called jump codes. Natually other additional codes may be included in such jump codes.

Figure 6:
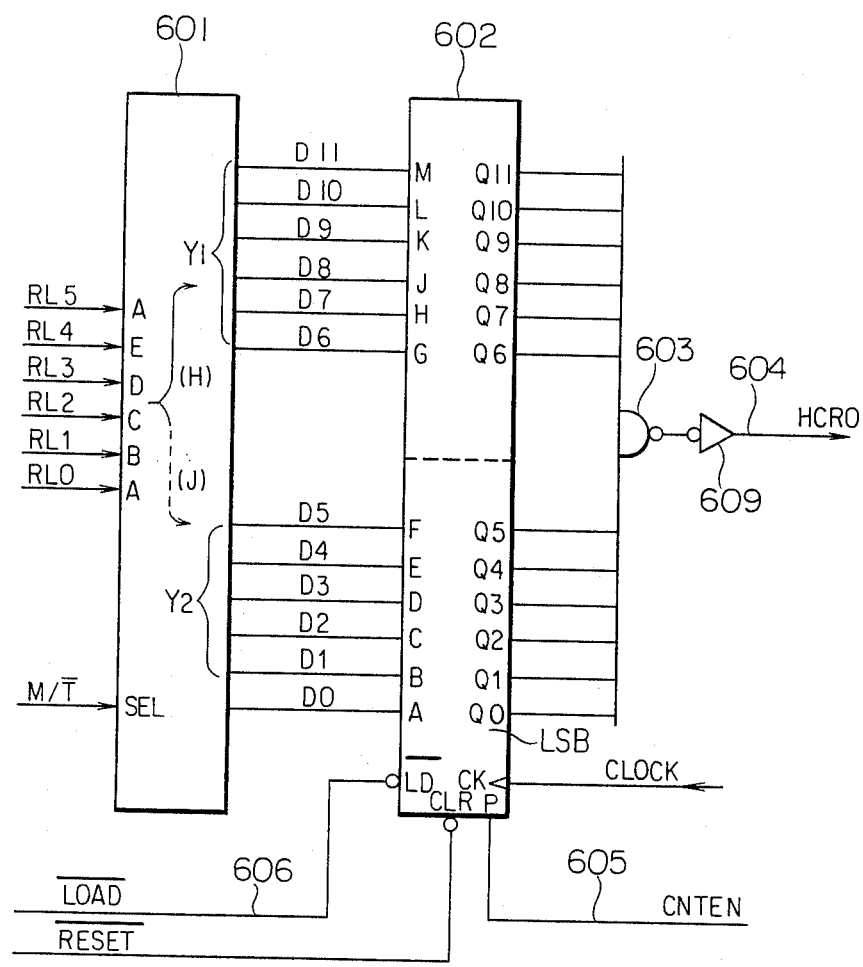
FIG. 6 is a block diagram of an example of a run length count circuit.

FIG. 6 shows the detailed structure of the run length count circuit 107 shown in FIG. 1.

A demultiplexer 601 receives the run length data RL5-RL0, in two's complement, form from the code table ROM 106 shown in FIG. 4, and supplies load (preset) data to a run length counter 602. The run length data RL5-RL0 supplied form the code table ROM contain only 6 bits as explained before, and the demultiplexer 601 replenishes the lower or the upper six bits as "1" according to whether the entered code is a makeup code or a terminating code. An input signal M/T to the demultiplexer 601 functions as a select signal for determining whether the entered run length data RL5-RL0 are released to output ports Y1 or Y2. The run length counter 602 is composed of a 12-bit binary counter. After presetting of an initial value (loading of the output of the multiplexer 601) by a $\overline{\text{LOAD}}$ signal 606 and after being enabled by a CNTEN signal 605, the run length counter 602 counts up the entered clock signals. When output signals Q0-Q11 of the counter reach a state of all "1" or (−1), a gate 603 releases a zero output whereby an inverter 607 releases a count end pulse HCR0 604 to terminate the counting operation.

Figure 7:
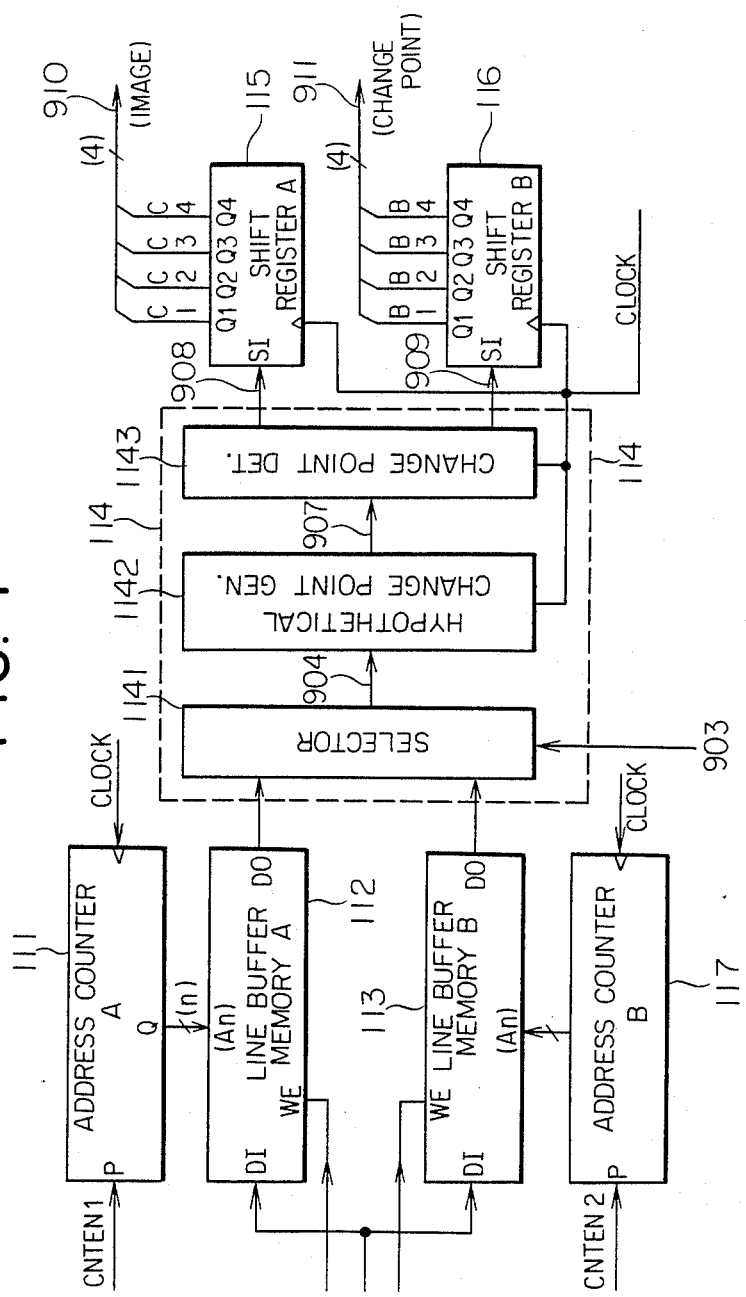
FIG. 7 is a block diagram of an example of a process circuit for image signal of a reference line.
Figure 8:
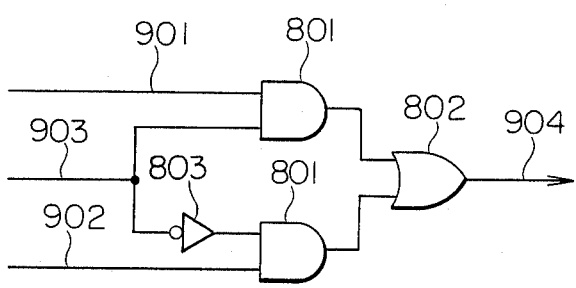
FIG. 8 is a circuit diagram of an example of a selector circuit.

Now reference is made to FIG. 7 for explaining the processing of the image signals read from the line buffer memories A 112 and B 113, under the control of the address counters A 111 and B 117 shown in FIG. 1. In FIG. 7, an image converting circuit 114 is composed of a selector 1141, a hypothetical changing point generating circuit 1142 and a changing point detection circuit 1143. Details of the selector circuit 1141 are shown in FIG. 8, wherein are provided AND gates 801, an OR gate 802 and an inverter 803. Data 901 read from the line buffer memory A 112 and data 902 read from the line buffer memory B 113 are alternately selected as reference image signals 904 for each line by means of a switching signal 903.

Figure 9:
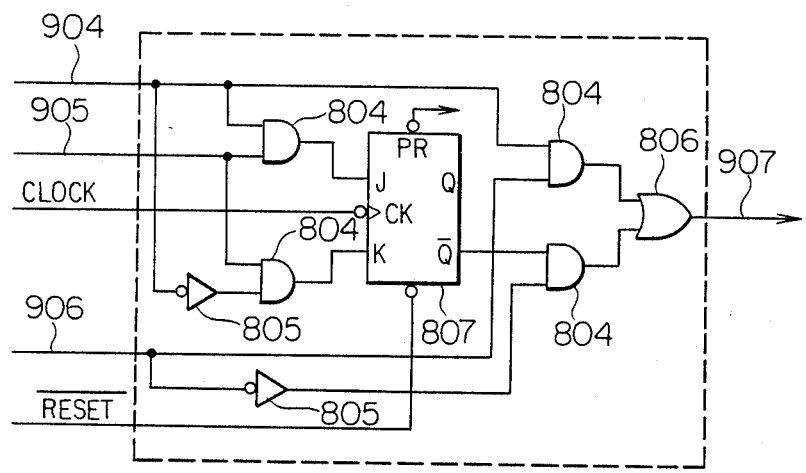
FIG. 9 is a circuit diagram of an example of a hypothetical changing point detecting circuit.

FIG. 9 shows the details of the hypothetical changing point generating circuit 1142, provided with AND gates 804, inverters 805, an OR gate 806 and a flip-flop 807. By means of a signal 905 indicating the position of final pixel of each reference entered from the selector 1141, the flip-flop 807 fetches the color of the last pixel of the image signals 904 of each reference line. Then, at the end of a horizontal synchronization signal 906, indicating the effective period of each line, the output $\overline{Q}$ of the flip-flop 807 is so selected that a succeeding pixel (hypothetical pixel) always assumes a color opposite to that of the pixel latched in the flip-flop 807, thus always forming a changing point.

Figure 10:
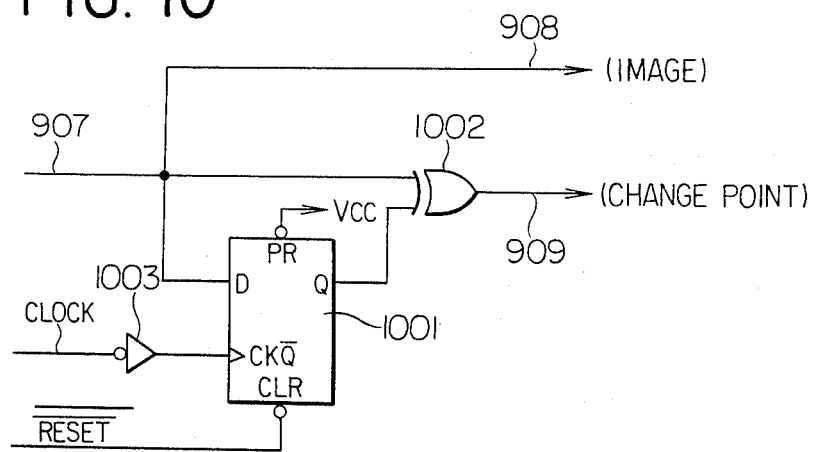
FIG. 10 is a circuit diagram of an example of a changing point detecting circuit.

FIG. 10 shows the changing point detection circuit 1143, composed of a flip-flop 1001, an exclusive OR gate 1002, and an inverter 1003. The output signal 907 of the hypothetical changing point generating circuit 1142 is supplied to the flip-flop 1001 and the exclusive OR gate 1002, and the output Q of said flip-flop 1001 is also supplied to the exclusive OR gate 1002 to detect a color change in neighboring pixels, thus releasing a detection signal 909.

Figure 11:
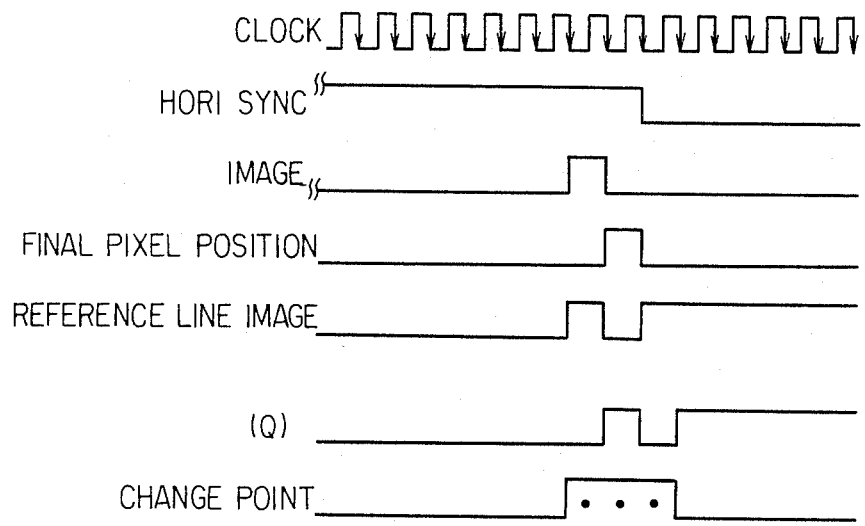
FIG. 11 is a timing chart showing the function of the circuits shown in FIGS. 9 and 10.

FIG. 11 is a timing chart showing the function of the circuits 1142 and 1143 shown in FIGS. 9 and 10.

A 4-bit shift register A 115 shown in FIG. 1 corresponds to register A 115 shown in FIG. 7.

Image data 908 of the reference line supplied from the changing point detection circuit 1143 to a terminal SI are shifted in succession by the clock signals, in the register A 115 in a direction from Q1 to Q4. The contents of said 4-bit register A 115 are always released as parallel signals 910 from terminals C1-C4. Thus the shift register A 115 always provides, in parallel manner, color information of four consecutive pixels of the reference line.

Similarly a 4-bit shift register A 116 shown in FIG. 1 corresponds to the register 116 shown in FIG. 7. Thus image changing point signal 909 of the reference line supplied from the changing point detection circuit 1143 to a terminal SI is shifted in succession in the shift register B 116, in a direction from Q1 to Q4 in response to clock signals. The content of said shift register is released as parallel signals 911 composed of B1-B4. In this manner the shift register B 116 always releases, in parallel manner, information indicating the presence and position of changing points in consecutive four pixels in the reference line.

Figure 12:
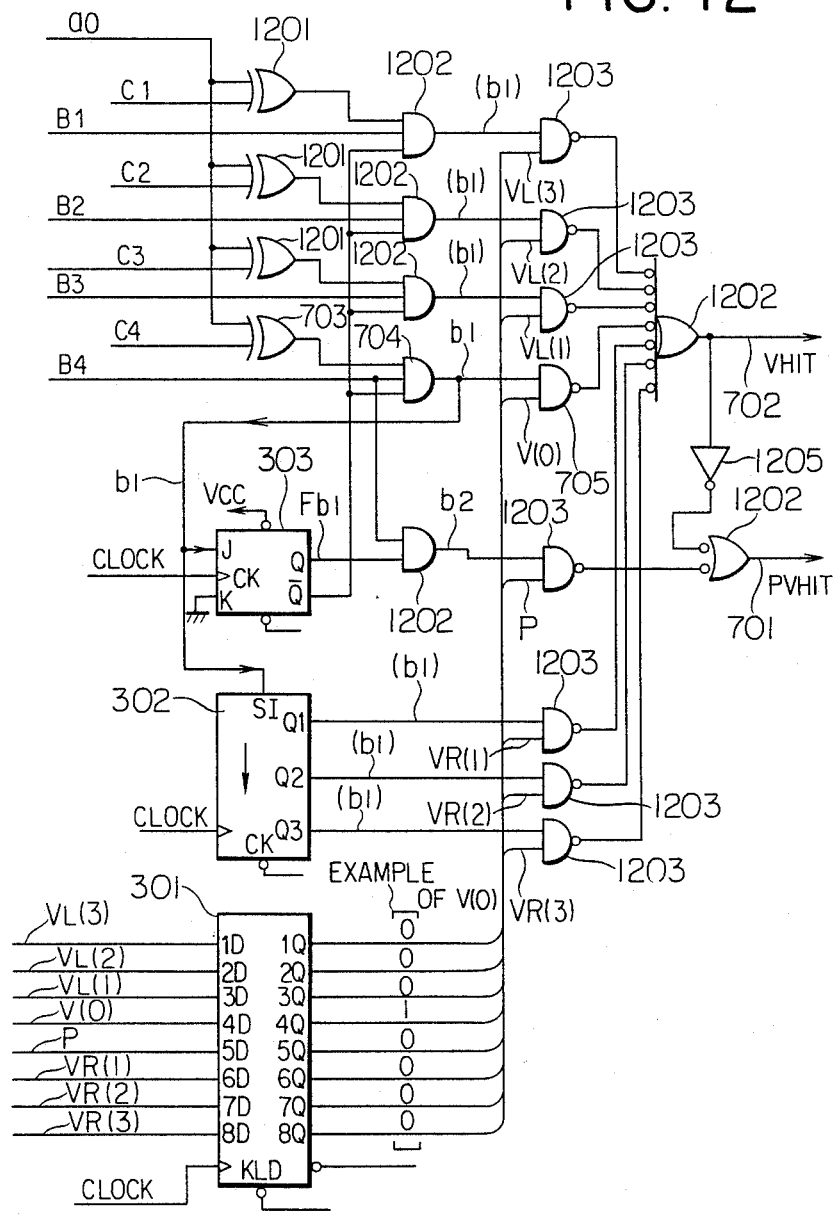
FIG. 12 is a circuit diagram of an example of a PV comparison circuit.

FIG. 12 shows the details of the PV reference circuit 105 shown in FIG. 1, wherein are provided exclusive OR gates 1201, 703, AND gates 1202, 704, NAND gates 1203, 705, an inverter 1205, and an 8-bit latch circuit 301. In response to a detection that the code stored in the register C 103 is a P-code or a V-code, the code detecting logic circuit 104 shown in FIG. 5 releases data in which a bit corresponding to the detected code alone is "1" and other bits are all "0", and the latch 301 receives and stores said code. The stored data are used as reference in the decoding of P- or V-mode codes. In FIG. 12, signals B1-B4 correspond to the signal 911 from the register B 116 shown in FIG. 7, and signals C1-C4 correspond to the signal 910 from the register A 115 shown in FIG. 7. Also, a signal $a_0$ in FIG. 12 corresponds to the symbol $a_0$ in two-dimensional encoding and indicates the color of starting pixel at each point of decoding. In the following other symbols will be represented likewise.

In FIG. 12, the exclusive OR gate 703 and AND gate 704 detect that a symbol $b_1$ is positioned at C4 in the shift register A115 in FIG. 7. The flip-flop 303 in FIG. 12 is set by the output signal of the AND gate 704, thus memorizing that the symbol $b_1$ has been detected in the above-mentioned position. A 3-bit shift register 302 receives, through a terminal SI thereof, the symbol $b_1$ detected by said AND gate 704, and stores said symbol for the succeeding three clock signals while it is transferred from Q1 to Q3. Thus, in the above-explained circuit structure, if a changing point $b_1$ is present in three pixels succeeding the output B4 of the shift register B 116, the AND gate 1202 releases a signal "1" at a corresponding position. Also if a changing point $b_1$ is present in three pixels preceding the output B4, the shift register 302 releases an output "1" at a corresponding position. The remaining circuitry in FIG. 12 is utilized for comparing decoding information of the P- or V-mode stored in the latch 301 with the information of the reference line obtained from the flip-flop 303, shift register 302, AND gate 704, etc. If a coincidence is found in said comparison, there is released a coincidence signal PVHiT 701 or VHiT 702. For example the signal VHiT is released when the output Q2 of the shift register 302 becomes "1" if a signal VR(2) is latched in the latch 301, or when the output of the AND gate 1202 becomes "1" if a signal VL(2) is latched in the latch 301. The signal PVHit indicates the completion of decoding of a V- or P-mode code, and the mode of a succeeding code is discriminated in response to said signal PVHiT.

Figure 13:
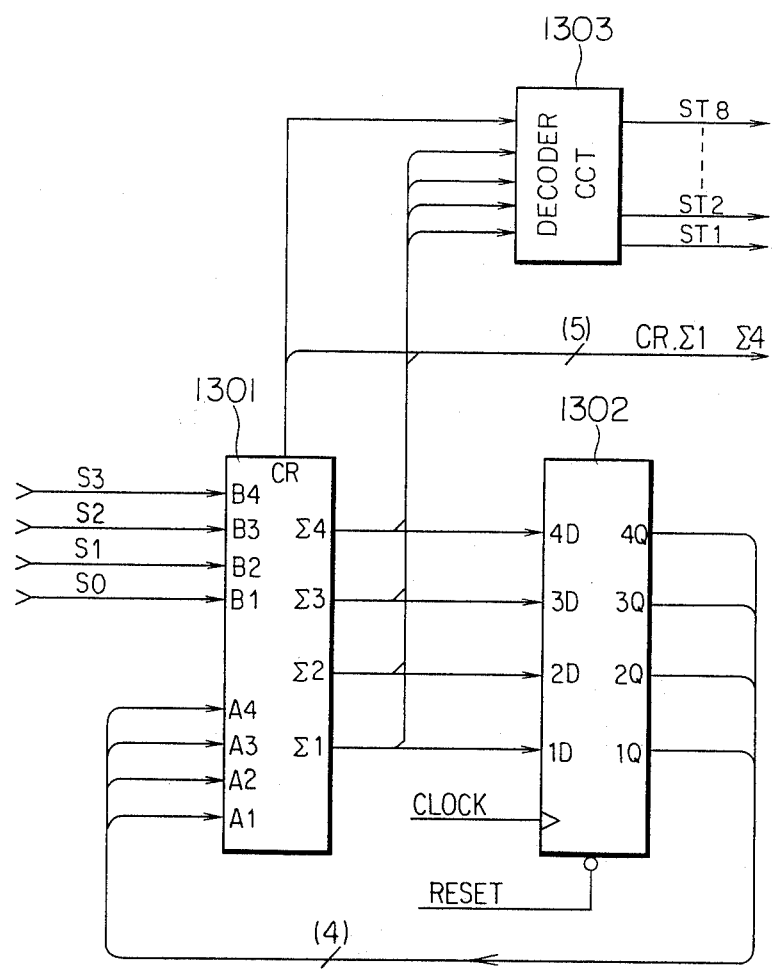
FIG. 13 is a circuit diagram of an example of a shift control circuit.

FIG. 13 shows the details of the shift control circuit 108 shown in FIG. 1, wherein are provided a 4-bit binary full-adder 1301 and a 4-bit latch 1302 which constitute a 4-bit binary accumulator. Input signals S0-S3 to the full-adder 1301 are obtained from the code detecting logic circuit 104 in FIG. 1 or from the code table ROM 106, and said signals indicate the amount of displacement of a code per clock in the register C 103. The amount of displacement obtained from the ROM 106 is always "1".

Thus the accumulator composed of the full-adder 1301 and the latch 1302 accumulates the number of empty bits in the register C, generated by the displacement of data therein. Also the output signals CR (carry) and $\Sigma 1-\Sigma 4$ of the full-adder 1301 indicate the number of empty bits in the register C 103 to be generated after a displacement of the amount indicated by the entered signals S0-S3. If the signal CR (=16) is released, a renewal request signal 201 (FIG. 2) is supplied to the memory circuit 101 shown in FIG. 1 to supply new data of 16 bits (B0-B15) from the memory circuit 101 to the register C 103.

As shown in Tabs. 1 and 2, the signals S0-S3 may assume a decimal value from 0 to 9. For example, if the output signal of the latch 1302, indicating the number of empty bits, is equal to a decimal number 15 and the signals S0-S3 indicate a number 9, there is obtained an accumulated value $9+15=24$. Thus, if a 9-bit jump shift is conducted in the register C 103, there will be generated 24 empty bits therein. Thus a new code is replenished from the memory circuit 101 shown in FIG. 1 to the register C 103 in the following manner. Since the register C 103 has a capacity of 31 bits, output signals C0-C6 of $31-24=7$ bits, transferred from C9-C15 shown in FIG. 3, are effective while the remaining bits C7-C30 are empty or ineffective. A new code of 16 bits read in parallel manner from the memory circuit 101 is added to the positions C7-C22 in the register C 103 so as not to form a gap between the codes therein. The position of the newly added code is controlled by selective function of the multiplexers A 1022 and B 1021, in response to the signals ST1-ST8 from a decoder 1303 in FIG. 13 and the signals CR and $\Sigma 1-\Sigma 4$ from the full-adder 1301, in such a manner that effective codes are always present in 16 bits from C0 to C15 in the register C 103.

Figure 14:
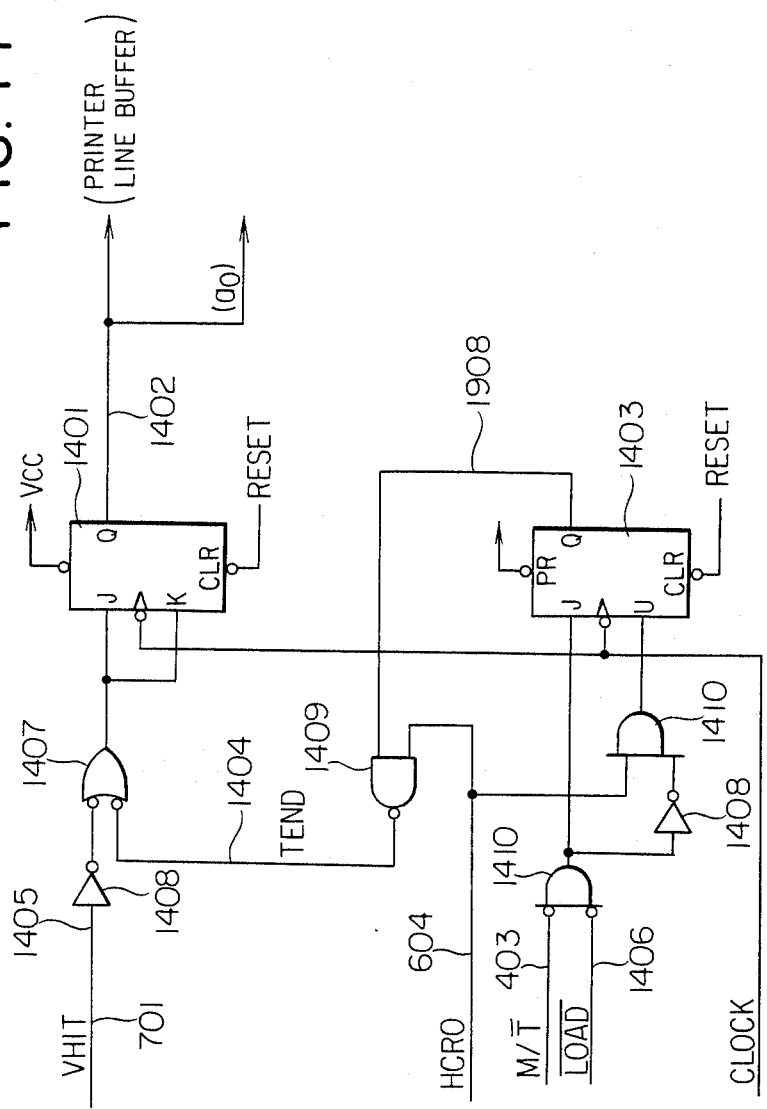
FIG. 14 is a circuit diagram of an example of an image regenerating circuit.

FIG. 14 shows the details of the image regenerating circuit 110 shown in FIG. 1, wherein are provided an OR gate 1407, inverters 1408, a NAND gate 1409 and AND gates 1410. The Q output signal 1402 of a flip-flop 1401 represents an image obtained by the decoding operation, and can be supplied to a printer 119, such as a laser beam printer, as shown in FIG. 1, to print a visible image on a recording sheet. The flip-flop 1401 is inverted by the VHiT signal 701 (FIG. 12) indicating that a V-mode code has been compared with the symbol $b_1$ on the reference line, or a TEND signal 1404 generated in response to a signal HCRO indicating that the run length counter 602 in FIG. 6 has completed a counting operation of a run length indicating by a terminating code. A flip-flop 1403 memorizes a fact that the run length counter 602 in FIG. 6 is in a counting operation of the run length indicated by the terminaing code. In the presence of the Q output of said flip-flop 1403, the flip-flop 1401 is not inverted by the HCRO signal 604 at the completion of run length counting of a makeup code, and the image color is not changed. Besides the flip-flop 1401 is not inverted by a comparison completion signal PVHiT for a P-mode code.

Figure 15:
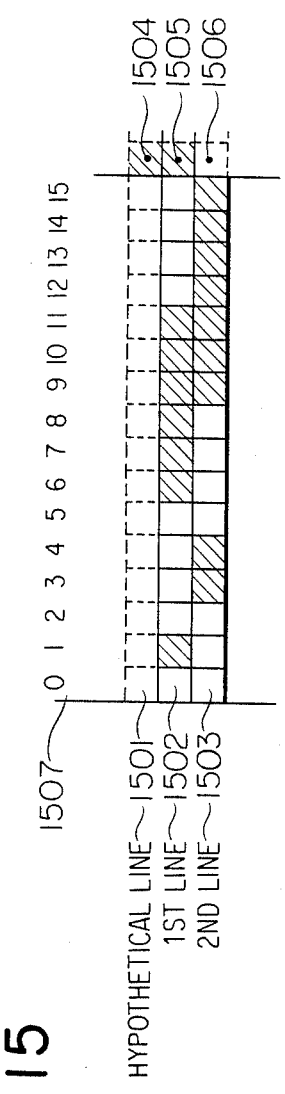
FIG. 15 is a chart showing an example of decoded image signal.

In the following there will be explained the function of the present embodiment in decoding an image shown in FIG. 15. In FIG. 15, a line 1501 is not real but hypothetical. A first line 1502 and a third line 1503 are both real time lines, each composed of 16 pixels in the present example.

In FIG. 15, pixels 1504, 1505, 1506 are not real images but are hypothetical pixels generated by the hypothetical changing point generated circuit 1142 in FIG. 7.

Figure 16:
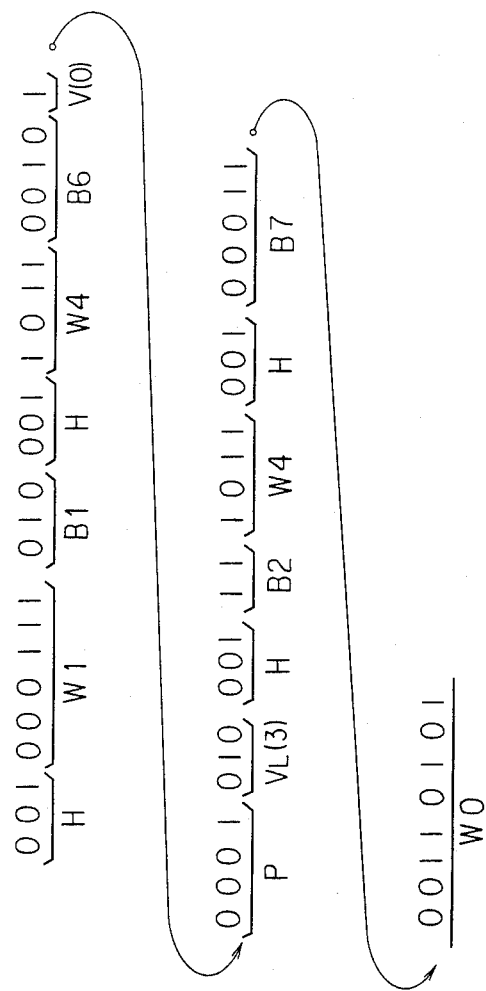
FIG. 16 is a chart showing a code train to be decoded.

Thus, in this example a page is composed of two lines, each containing 16 pixels. Therefore, in the following there will be explained a case of obtaining, from the memory circuit 101, code information shown in FIG. 16 obtained by MMR encoding of the image shown in FIG. 15 and regenerating said image. The number of pixels in each image line is fixed in a page by the encoding rule and is given to the decoding circuit prior to the decoding operation.

Figure 17:
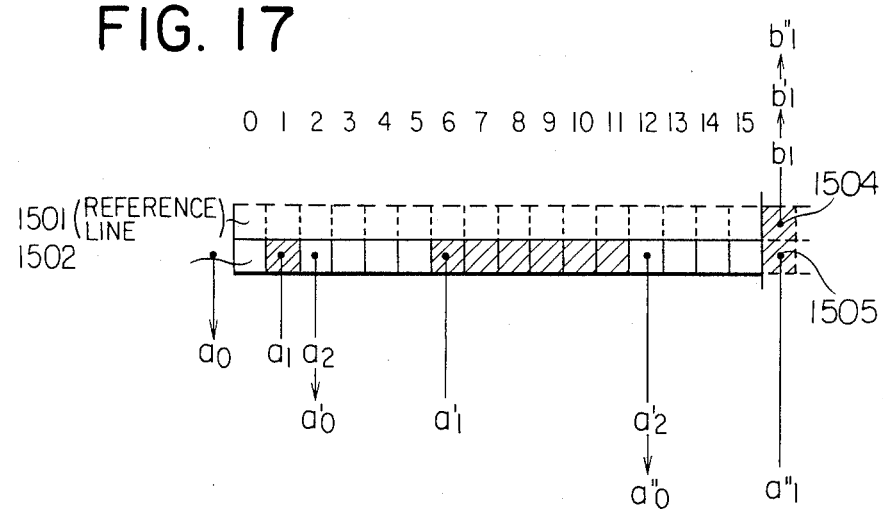
FIGS. 17 and 18 are charts showing decoding operation for first and second lines.
Figure 18:
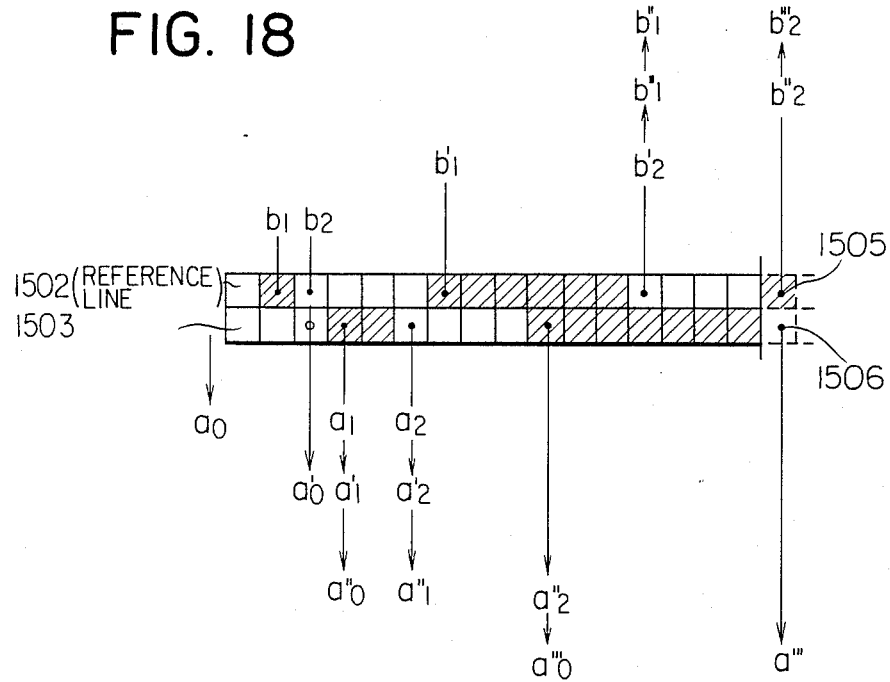

FIG. 17 shows the relationship of the reference line and symbols in the decoding of the first line, and FIG. 18 shows a similar relationship in the decoding of the second line.

FIG. 19 is a timing chart of the decoding operation, which is conducted according to image clock signals 1915. A horizontal synchronization signal 120 HSYNC is supplied from the exterior, for example, from the printer 119 shown in FIG. 1 in synchronization with the printing operation of each line, and the decoding circuit of the present embodiment performs the decoding operation for each line in synchronization with said synchronization signal 120. Thus said synchronization signal 120 is utilized as a trigger signal for initiating the decoding operation for each line.

In FIG. 19, signals CNTEN1 (1901) and CNTEN2 (1902) respectively enable counting operation of the address counters A 111 and B 117 shown in FIG. 7.

A signal 1903 represents the output of the address counter A 111 initiating the counting operation by said CNTEN1 signal, and is supplied, as a memory address to the line buffer memory A 112 shown in FIG. 7. Similarly a signal 1904 represents the memory address of the line buffer memory a in FIG. 7.

Signals 908, 910, 909 and 911 are input and output signals of the shift registers A 115 and B 116 shown in FIG. 7, and have waveforms corresponding to the image shown in FIG. 15.

The buffer memories A 112 and B 113 shown in FIG. 7 alternatively perform reading and writing operations in such a manner that the reading said always precedes by a period corresponding to five clocks, since the decoding of code data is rendered possible only when the information on the changing point and color for the first pixel of the reference line reaches the output Q4 of the shift registers B116 and A 115 shown in FIG. 7. The number of clocks can be made other than 5, however, by the suitable selection of the number of bits of the shift register or the number of timing latches for decording operation.

FIG. 20 shows the displacement of codes in the register C 103 in the decoding of the first line 1502 shown in FIG. 15. The HSYNC1 signal shown in FIG. 19 triggers the decoding operation, thus initiating the reading operation in the buffer memory A shown in FIG. 7. The buffer memory A releases the data of a reference line in this state, and, according to the encoding rule, the hypothetical line of all white is read as the reference line for decoding the first line. In this manner, in the initial state, the content of the buffer memory A is cleared to all zero.

It is assumed that the code data in the register C 103 shown in FIG. 3 are in a state shown in FIG. 20(A) when the decoding operation is to be started. At a time t-1, an H-mode code and a W1 code are simultaneously detected, from the output signals C0–C8 of the register C, by the code detecting logic circuit 104 shown in FIG. 1. Thus there is identified a code input of horizontal mode, and the compliment (−1) to 2 of the run length 1 of the W1 code is loaded to the input terminals A–F of the run length counter 602 shown in FIG. 6. Signals "1" are loaded to the terminals G–M of said run length counter 602. In this state a signal 1913, shown in FIG. 19, is utilized to store, for example in a flip-flop, that a first terminating code of H-mode, which is the W1 code in this case, has been detected. Since the W1 code has a code length of 6 and is a jump code as explained before, the register C effects a jump shift of 6 bits in a clock timing. Since the W1 code is a terminating code, the flip-flop 1403 shown in FIG. 14 is set by the signal M/T simultaneously with the loading of said run length, thus memorizing a fact that the terminator value is loaded in the run length counter 602 (signal 1908 in FIG. 19).

Thus, at a time t0, the register C assumes a state shown in FIG. 20(B), achieved by a 6-bit shift from the state at the time t-1. Then the TEND signal 1404 shown in FIG. 14, is released to invert the output of the flip-flop 1401, at a time t1 after t0 by a clock, and the color of the changes from white to black as shown by 1910 in FIG. 19.

Also at the time t0, a B1H code is detected (second terminating code in the H-mode) from the output signals C3–C6 of the register C 103 in the state of FIG. 20(B), in response to the TEND signal corresponding to the HCRO signal. The B1H code has a run length 1 (compliment (−1)), a code length 3 and is a jump code. Thus (−1) is loaded again in the run length counter 602. In response to the detection of said B1H code the decoding operation of the H-mode code is completed, and a succeeding mode is decoded. In this state the register C 103 performs a jump shift of 6 bits, which is equal to the sum of the code length 3 of the B1H code and the code length 3 of the H-code, in order to position the leading bit of the succeeding code at the output C0 of the register C 103, whereby the state shown in FIG. 20(C) is reached. Then the HCRO signal at the time t1 inverts the flip-flop 1404 in FIG. 14, at a time t2.

At the time t1, an H-mode code and a W4 code are detected from the register C 103 in a state shown in FIG. 20(C). The function thereafter is same in the state shown in FIG. 20(A).

Then at a time t5, a B6 code is detected from the register C 103 of a state shown in FIG. 20(D). The B6 code has a code length of 4 and is not a jump code. Thus the register C 103 performs a stepwise displacement from the time t5 and reaches a state shown in FIG. 20(E) at time t9. In this state the B6 code has been detected as a second terminating code in the H-mode, and is further subjected to a 3-bit jump shift at the time t9, in order to position the leading end of a succeeding code at the output C0 of the register C 103. Thus the register C 103 assumes a state shown in FIG. 20(F) at a time t10.

Then, the HCRO signal is released at a time t11, whereby the flip-flop 1401 shown in FIG. 14 is inverted and, from the register C 103, there is detected a succeeding code, which is a V(0) code in the V-mode. Thus a signal "1" is set in the V(0) bit of the latch 301 in FIG. 12, while other bits remain as "0". Since the H-mode is not assumed in this state, the run length counter 602 in FIG. 6 is not activated, and the HCRO signal is not released. Said V(0) bit of the latch 301 is compared, in the PV reference circuit 105, with the symbol b1 from the AND gate 704 receiving the output B4 of the shift register B 116 shown in FIG. 7, by means of the NAND gate 705. Thus, when the AN1 gate 704 releases a signal "1" to cause the NAND gate 705 and OR gate 1202 to release the VHiT signal, the flip-flop 1401 shown in FIG. 14 is inverted. In this manner there is regenerated an image as represented by 1901 in FIG. 19. The effective period of the regenerated image is indicated by signal 1914 shown in FIG. 19. The image 1910 is supplied to the printer 119, and also stored in the line buffer B 113 which is in a parallel writing operation, for use as the reference line for decoding of the second line. Said regenerated image is also used as the symbol a0. The regeneration or decoding of the image is conducted in this manner.

As will be apparent from the foregoing explanation, various circuit blocks of the present embodiment receive common image clock signals from the control circuit 118 shown in FIG. 1, and the decoding operation is conducted in synchronization with said image clock signals, at a speed corresponding to the interval of the clock signals. The decoding operation is interrupted if the supply of said clock signals is interrupted for a period. It is therefore rendered possible to control the speed of decoding operation, by regulating the frequency of the clock signals commonly supplied to the various blocks of the decoding circuit.

Therefore, the data processing speed of printer or computer need not be matched with the decoding speed. On the other hand, the decoding operation can be conducted with a speed matching the processing speed of a succeeding device, such as a printer, by utilizing clock signals synchronized with the speed of said printer. Consequently a decoding circuit can be commonly used for plural printers of different processing speeds. Also in case such succeeding device functions intermittently as in a computer, the decoding operation can also be conducted intermittently by supplying the clock signals only during the data fetching period and interrupting the supply of clock signals in other periods.

The above-explained decoding process provides following advantages:

(1) Image can be regenerated without interruption during a line, in synchronization with continuous clock signals. Also plural lines can be decoded in a continuous and synchronized manner. The image thus regenerated can be directly supplied for example to a laser beam printer to obtain a recorded image. In this manner real-time decoding is rendered possible.

(2) A high-speed decoding operation can always be assured regardless of the complexity of image or of the compression code. In actual measurement, an A3-sized image of a density of 16 pel/25.4 mm in the main and sub-scanning directions could always be decoded in 1.5 seconds.

(3) Memory can be economized for example in case of high-speed image output, since the image can be directly decoded and released from compression codes, without the necessity of usual temporary storage of decoded image in a memory.

Although the foregoing explanation has been limited to the decoding of two-dimensionally encoded data utilizing the relationship with a reference line, the same process is also applicable not only to MMR encoding but MR encoding in which one- and two-dimensional encodings are mixed. Also the data to be decoded may be those released by a computer or transmitted by facsimile.

TABLE 1

| Code name | \multicolumn{7}{c}{Code} | \multicolumn{4}{c}{Code length} |
|---|---|---|---|---|---|---|---|---|---|---|---|
| | C0 | C1 | C2 | C3 | C4 | C5 | C6 | S3 | S2 | S1 | S0 |
| Group 1 P | 0 | 0 | 0 | 1 | | | | 0 | 1 | 0 | 0 |
| H | 0 | 0 | 1 | | | | | 0 | 0 | 1 | 1 |
| $V_R(3)$ | 0 | 0 | 0 | 0 | 0 | 1 | 1 | 0 | 1 | 1 | 1 |
| $V_R(2)$ | 0 | 0 | 0 | 0 | 1 | 1 | | 0 | 1 | 1 | 0 |
| $V_R(1)$ | 0 | 1 | 1 | | | | | 0 | 0 | 1 | 1 |
| $V(0)$ | 1 | | | | | | | 0 | 0 | 0 | 1 |
| $V_L(1)$ | 0 | 1 | 0 | | | | | 0 | 0 | 1 | 1 |
| $V_L(2)$ | 0 | 0 | 0 | 0 | 1 | 0 | | 0 | 1 | 1 | 0 |
| $V_L(3)$ | 0 | 0 | 0 | 0 | 0 | 1 | 0 | 0 | 1 | 1 | 1 |

TABLE 2

| Code name | \multicolumn{7}{c}{Code} | \multicolumn{4}{c}{Code length} |
|---|---|---|---|---|---|---|---|---|---|---|---|
| | C3 | C4 | C5 | C6 | C7 | C8 | C9 | S3 | S2 | S1 | S0 |
| Group 2 W1 | 0 | 0 | 0 | 1 | 1 | 1 | | 0 | 1 | 1 | 0 |
| W1H* | 0 | 0 | 0 | 1 | 1 | 1 | | 1 | 0 | 0 | 1 |
| W2 | 0 | 1 | 1 | 1 | | | | 0 | 1 | 0 | 0 |
| W3 | 1 | 0 | 0 | 0 | | | | 0 | 1 | 0 | 0 |
| W4 | 1 | 0 | 1 | 1 | | | | 0 | 1 | 0 | 0 |
| B1 | 0 | 1 | 0 | | | | | 0 | 0 | 1 | 1 |
| B1H* | 0 | 1 | 0 | | | | | 0 | 1 | 1 | 0 |
| B2 | 1 | 1 | | | | | | 0 | 0 | 1 | 0 |

Note:
Mark *indicates the case of a second terminating code in the H-mode.

As detailedly explained in the foregoing, it is rendered possible to achieve high-speed decoding operation by releasing the image information of a reference line in parallel manner by a predetermined number of pixels at a time and forming image signals through comparison with image codes, thereby enabling rapid discrimination of the correlation between the reference line and the entered image codes.

Also a high-speed decoding operation without interruption can be achieved even for the decoding of image codes different in code length, since the operation for a succeeding code is varied according to a preceding code discriminated for decoding.

Furthermore, a high-speed decoding operation can be achieved without delay in the decoding of two-dimensionally encoded image codes such as those obtained by MR or MMR encoding, since a horizontal-mode identification code and a succeeding run length code are simultaneously discriminated.

Furthermore a high-speed decoding operation can be achieved in the decoding of two-dimensionally encoded image codes such as obtained by MR or MMR encoding, since, in the horizontal mode, a run length code can be decoded without the release of a preceding horizontal-mode identification code.

Furthermore, a high-speed decoding operation can be achieved with satisfactory accuracy, since the decoding operation is initiated after there are fetched image signals of the reference line of a number of pixels necessary for the decoding of image codes.

Furthermore, it is rendered possible to utilize a decoding apparatus commonly for plural output devices since the decoding operation is conducted in synchronization with clock signals to enable a decoding operation matching the function of such output devices such as printers.

What is claimed is:

1. A decoding apparatus for decoding an image code developed so that positions of level change in two-level image signals are coded, said apparatus comprising:
    means for outputting, in parallel manner, image information representing a predetermined number of pixels included in a reference line;
    means for discriminating a mode of entered image code;
    means for monitoring a relationship between a result of discrimination performed by said discriminating means and the parallel output of said outputting means; and
    means for forming image signals based on the output of said monitoring means.

2. A decoding apparatus according to claim 1, wherein said outputting means is adapted to output information on changing point and color of the image of the reference line.

3. A decoding apparatus according to claim 1, further comprising means for storing the image signals formed by said forming means, as the reference image information to be employed in the decoding of the image codes of a succeeding line.

4. A decoding apparatus according to claim 1, wherein said outputting means is adapted to output, in parallel manner, image information of the number of pixels necessary for the decoding of image codes.

5. A decoding apparatus for decoding an image code developed so that positions of level change in two-level image signals are coded, said apparatus comprising:
    means for outputting image information of a reference line;
    means for continuously storing a plurality of image codes;
    means for discriminating content of image codes stored in said storage means;
    means for forming image signals based on a relationship between a result of discrimination performed by said discriminating means and the output of said outputting means; and
    means for discharging from said storage means the image code used for forming image signals by said forming means,
    wherein said discharge means is adapted to vary the code discharging operation from said storage means in accordance with a relationship of the image code to be discharged and formed image signals.

6. A decoding apparatus according to claim 5, wherein said discharge means is operable in a first discharge mode for discharging the code bit by bit from said storage means, and in a second discharge mode for discharging the code plural bits at once.

7. A decoding apparatus according to claim 5, wherein said discharge means is adapted to vary the code discharging operation in accordance with the code length of the code to be discharged and the length of the image signals formed corresponding to said code.

8. A decoding apparatus according to claim 5, further comprising means for storing the image signals formed by said forming means, as the reference image information to be employed in the decoding of the image codes of a succeeding line.

9. A decoding apparatus for decoding an image code developed so that positions of level change in two-level image signals are coded, said apparatus comprising:
   means for outputting image information of a reference line;
   means for discriminating a mode of entered image code;
   first forming means for forming image signals based on a relationship between a result of discrimination performed by said discriminating means and the output of said outputting means in a case of image code of a mode which does not accompany data representing run length; and
   second forming means for forming image signals based on data representing run length, in a case of image data which accompanies data representing run length,
   wherein said second forming means makes it possible to judge, by means of said discriminating means image code of the mode accompanying data representing run length and simultaneously to analyze the data representing the run length.

10. A decoding apparatus according to claim 9, wherein said second forming means is adapted to form image signals in accordance with the count of run length.

11. A decoding apparatus according to claim 10, further comprising means for storing the image signals formed by said first and second forming means, as the reference image information to be employed in the decoding of the image codes of a succeeding line.

12. A decoding apparatus for decoding an image code developed so that positions of level change in two-level image signals are coded, said apparatus comprising:
   means for outputting image information of a reference line;
   means for continuously storing a plurality of image code;
   means for discriminating a mode of image code stored in said storage means;
   first forming means for forming image signals based on a relationship between a result of discrimination performed by said discriminating means and the output of said outputting means, in a case of image code of a first mode, which does not accompany data representing run length;
   second forming means for forming image signals based on data representing run length in a case of image code of a second mode, which accompanies data representing run length; and
   means for discharging from said storage means the image code used for forming image signals,
   wherein said discharge means wherein said discharging means discharges image code of first mode after the first mode has been discriminated, and discharge image code of the second mode together with the data representing run length.

13. A decoding apparatus according to claim 12, wherein said second forming means is adapted to discriminate the mode of image code by said discriminating means and simultaneously analyze the data representing run length.

14. A decoding apparatus according to claim 12, wherein said discharge means is adapted to effect a discharging operation in accordance with the code length of the code to be discharged.

15. A decoding apparatus according to claim 12, further comprising means for storing the image signals formed by said first and second forming means, as the reference image information to be employed in the decoding of the image codes of a succeeding line.

16. A decoding apparatus for decoding an image code developed so that positions of level change in two-level image signals are coded, said apparatus comprising:
   means for taking in image information of a reference line and outputting the image information;
   means for discriminating a mode of entered image code; and
   means for forming image signals based on a relationship between a result of discrimination by said discriminating means and the output of said taking-in means,
   wherein the decoding operation performed by said discriminating means and said image forming means is initiated after the taking in of image information of the number of pixels necessary for the decoding of image code by means of said taking-in means.

17. A decoding apparatus according to claim 16, wherein said taking-in means is adapted to output the image information of the reference line in parallel manner by a predetermined number of pixels at a time.

18. A decoding apparatus according to claim 16, further comprising means for storing the image signals formed by said forming means, as the reference image information to be employed in the decoding of the image codes of a succeeding line.

19. A decoding apparatus for decoding an image code developed so that positions of level change in two-level image signals are coded, said apparatus comprising:
   means for outputting image signals of a reference line;
   means for discriminating the entered image codes; and
   means for forming image signals based on a relationship between a result of discrimination performed by said discriminating means and the output of said outputting means,
   wherein said apparatus is arranged such that all of said means are operated in synchronism with common clock signals, so that the progress of the decoding operation by said discriminating means and said image forming means is controlled by means of changing the supplying state of said common clock signals.

20. A decoding apparatus according to claim 19, further comprising storage means for storing the image codes to be decoded, wherein the image codes are supplied from said storage means to said discriminating means in accordance with the progress of the decoding operation.

21. A decoding apparatus according to claim 19, wherein the decoding operation is stopped by stop of the supply of the common clock signals.

22. A decoding apparatus according to claim 19, further comprising means for storing the image signals formed by said forming means, as the reference image information to be employed in the decoding of the image codes of a succeeding line.

* * * * *

UNITED STATES PATENT AND TRADEMARK OFFICE
CERTIFICATE OF CORRECTION

PATENT NO. : 4,750,043

DATED : June 7, 1988

INVENTOR(S) : KATSUTOSHI HISADA, ET AL.

It is certified that error appears in the above-identified patent and that said Letters Patent is hereby corrected as shown below:

AT [75] IN INVENTORS

"Nobuaki Kokuba," should read --Nobuaki Kokubu,--.

AT [57] IN THE ABSTRACT

Line 2, "or modified READ" should read --or modified modified READ--.

IN THE DRAWINGS

Sheet 15, Figure 19A, "909 CHAGE POINT (SI)" should read --909 CHARGE POINT (SI)--.

Sheet 15, Figure 19A, "1911 PV LACHING" should read --1911 PV LATCHING--.

Sheet 17, Figure 20, "JAMP" should read --JUMP-- (all occurrences).

COLUMN 1

Line 11, --2. Description of the Background Art-- should be inserted.

Line 19, "Nos." should read --No.--.

Line 21, "Nos." should read --No.--.

COLUMN 3

Line 67, "refernece" should read --reference--.

UNITED STATES PATENT AND TRADEMARK OFFICE
CERTIFICATE OF CORRECTION

PATENT NO. : 4,750,043

DATED : June 7, 1988

INVENTOR(S) : KATSUTOSHI HISADA, ET AL.

It is certified that error appears in the above-identified patent and that said Letters Patent is hereby corrected as shown below:

COLUMN 4

Line 5, "of" should be deleted.

COLUMN 5

Line 34, "sotred" should read --stored--.

COLUMN 6

Line 21, "compliment" should read --complement--.
Line 24, "code" should read --code,--.

COLUMN 7

Line 4, "Natually" should read --Naturally--.
Line 9, "complement, form" should read --complement form,--.
Line 12, "form" should read --from--.

COLUMN 8

Line 10, "register A 116" should read --register B 116--.
Line 68, "signal PVHit" should read --signal PVHiT--.

COLUMN 9

Line 62, "indicating" should read --indicated--.

UNITED STATES PATENT AND TRADEMARK OFFICE
CERTIFICATE OF CORRECTION

PATENT NO. : 4,750,043

DATED : June 7, 1988

INVENTOR(S) : KATSUTOSHI HISADA, ET AL.

It is certified that error appears in the above-identified patent and that said Letters Patent is hereby corrected as shown below:

COLUMN 10

Line 12, "generated" should read --generating--.
Line 45, "a" should read --B--.
Line 52, "said" should be deleted.
Line 60, "decording" should read --decoding--.

COLUMN 11

Line 12, "compliment" should read --complement--.
Line 33, "of the" should be deleted.
Line 40, "(compliment (-1))," should read --(complement (-1)),--.
Line 54, "same in" should read --the same as in--.

COLUMN 12

Line 11, "ANI gate 704" should read --AND gate 704--.

COLUMN 15

Line 38, "code;" should read --codes;--.
Line 54, "wherein said discharge means" should be deleted.
Line 57, "charge" should read --charges--.

UNITED STATES PATENT AND TRADEMARK OFFICE
CERTIFICATE OF CORRECTION

PATENT NO. : 4,750,043

DATED : June 7, 1988

INVENTOR(S) : KATSUTOSHI HISADA, ET AL.

It is certified that error appears in the above-identified patent and that said Letters Patent is hereby corrected as shown below:

COLUMN 16

Line 1, "code" should read --run--.

Signed and Sealed this

Third Day of January, 1989

Attest:

DONALD J. QUIGG

Attesting Officer

Commissioner of Patents and Trademarks